United States Patent
Huard et al.

(10) Patent No.: US 10,634,715 B2
(45) Date of Patent: Apr. 28, 2020

(54) METHOD FOR ESTIMATING AN OPERATING PROFILE OF AN INTEGRATED CIRCUIT OF A SYSTEM-ON-A-CHIP, AND CORRESPONDING SYSTEM-ON-A-CHIP

(71) Applicants: STMicroelectronics (Crolles 2) SAS, Crolles (FR); STMicroelectronics SA, Montrouge (FR)

(72) Inventors: Vincent Huard, Le Versoud (FR); Chittoor Parthasarathy, Grenoble (FR)

(73) Assignees: STMicroelectronics (Crolles 2) SAS, Crolles (FR); STMicroelectronics SA, Montrouge (FR)

(*) Notice: Subject to any disclaimer, the term of this patent is extended or adjusted under 35 U.S.C. 154(b) by 0 days.

(21) Appl. No.: 16/424,034

(22) Filed: May 28, 2019

(65) Prior Publication Data

US 2019/0285694 A1    Sep. 19, 2019

Related U.S. Application Data

(63) Continuation of application No. 15/468,798, filed on Mar. 24, 2017, now Pat. No. 10,302,693.

(30) Foreign Application Priority Data

Aug. 3, 2016   (FR) ...................................... 16 57535

(51) Int. Cl.
    *G01R 31/28*   (2006.01)

(52) U.S. Cl.
    CPC ..... *G01R 31/2858* (2013.01); *G01R 31/2856* (2013.01); *G01R 31/2884* (2013.01); *G01R 31/2896* (2013.01)

(58) Field of Classification Search
    CPC  G01R 1/0491; G01R 31/265; G01R 31/3012; G01R 31/318511
    See application file for complete search history.

(56) References Cited

U.S. PATENT DOCUMENTS

| 7,977,729 B2* | 7/2011 | Watanabe ............... G04F 10/10 257/316 |
| 8,154,335 B2 | 4/2012 | Chawla et al. |

(Continued)

FOREIGN PATENT DOCUMENTS

EP   2988141 A1   2/2016

OTHER PUBLICATIONS

INPI Search Report and Written Opinion for FR 1657535 dated Apr. 6, 2017 (7 pages).

*Primary Examiner* — Tung X Nguyen
(74) *Attorney, Agent, or Firm* — Crowe & Dunlevy

(57) ABSTRACT

A method for determining a margin of use of an integrated circuit includes monitoring at least one sensor so as to determine at least one physical parameter representative of use of the integrated circuit, evaluating the at least one physical parameter to determine an instantaneous state of aging of the integrated circuit as a function of the at least one physical parameter, and calculating the margin of use for the integrated circuit from a comparison of the instantaneous state of aging with a presumed state of aging. If operation of the integrated circuit is outside the margin of use, at least one operating performance point of the integrated circuit is adjusted so as to bring operation of the integrated circuit back within the margin of use.

22 Claims, 4 Drawing Sheets

(56) References Cited

U.S. PATENT DOCUMENTS

| | | |
|---|---|---|
| 2004/0061518 A1 | 4/2004 | Watanabe et al. |
| 2009/0228727 A1 | 9/2009 | Tamura et al. |
| 2010/0188115 A1 | 7/2010 | von Kaenel |
| 2011/0181315 A1* | 7/2011 | Krishnan ........... G01R 31/3016 324/762.01 |
| 2011/0314312 A1 | 12/2011 | Naffziger et al. |
| 2013/0117582 A1 | 5/2013 | Satyamoorthy et al. |
| 2016/0077569 A1 | 3/2016 | Aizik et al. |

\* cited by examiner

METHOD FOR ESTIMATING AN OPERATING PROFILE OF AN INTEGRATED CIRCUIT OF A SYSTEM-ON-A-CHIP, AND CORRESPONDING SYSTEM-ON-A-CHIP

CROSS REFERENCE TO RELATED APPLICATIONS

This application is a continuation of U.S. patent application Ser. No. 15/468,798, filed Mar. 24, 2017 now U.S. patent Ser. No. 10/302,693, which claims the priority benefit of French Application for Patent No. 1657535, filed on Aug. 3, 2016, the disclosures of which are hereby incorporated by reference in their entireties to the maximum extent allowable by law.

TECHNICAL FIELD

Various embodiments and their implementation relate to systems-on-a-chip, notably the estimation of an operating profile of an integrated circuit belonging to a system-on-a-chip and, more particularly, the adjustment of a power supply voltage in the framework of the management of the reliability of such systems.

BACKGROUND

In the current systems-on-a-chip (SoC), the aging of the electronic components is anticipated during the design of the systems.

Usually, the aging is compensated by allocating an excess, or a compensation, of voltage to the power supply voltage, in order for the aged components to continue to operate in a satisfactory manner within a "worn" product. For example, an excess of 40 mV for a power supply of 150 mV is usually provided for the first uses of such a system-on-a-chip.

As a consequence, this compensation leads to an excessive energy consumption from the first use, which represents a handicap within the framework of applications in which the energy efficiency is primordial, for example in the case of a weak battery or with an objective of minimal energy dissipation.

Furthermore, these losses in performance may be even more serious when a system-on-a-chip of the same design is used for various mission profiles. A mission profile is a model of use corresponding to various stresses to which the system-on-a-chip must be subjected. By way of illustration, a system designed for industry will be subjected to a more intensive use than a system designed for motor vehicles, which itself will be subjected to a more intensive use than a system used by individuals.

The systems-on-a-chip usable for various mission profiles are consequently designed in order to withstand the model with the most severe stresses, and this represents a loss of competitiveness owing to conventional energy values (referred to as a Power Purchase Agreement (PPA)) that are poorly adhered to for mission profiles that are less demanding.

Thus, the optimization of the power supply in systems for managing the aging of electronic components represents a problem area in the compromise between performance characteristics and reliability, taking into account the limitations of the systems-on-a-chip comprising the components.

It would therefore be desirable to overcome this problematic feature by providing an adaptive compensation for the aging of systems-on-a-chip.

With regard to adaptive adjustment of the voltage/frequency (AVF/AFS) of a system-on-a-chip, U.S. Pat. No. 8,154,335 (incorporated by reference) describes a system-on-a-chip in which a power supply voltage is reduced and/or a clock frequency is increased in order to recover conditions of use within acceptable margins, the margins being generated by a circuit for replicating a critical path. This teaching also describes an increase in the voltage and/or a decrease in the frequency for preventative purposes in the case of exceeding the acceptable margins for conditions of use.

However, the solution provided in the aforementioned U.S. Pat. No. 8,154,335 is adapted to occasional variations in the operation of the system-on-a-chip, and does not take into consideration the longer term problems of excess power supply and aging previously described.

There accordingly exists a need to estimate an operating profile of an integrated circuit of a system-on-a-chip taking into account the long-term aging of the system-on-a-chip.

SUMMARY

According to one embodiment and its implementation, the idea is to provide an estimation device for a system-on-a-chip capable of calculating a margin of use based on the real states of aging of components of this system-on-a-chip obtained through the observation of its practical use.

A state of aging is a data value representative of the use to which a given component has been subjected, at a given moment in time, starting from its first uses and implementations.

The component in question may preferably be one or more integrated circuit(s) forming the logic of a calculation unit, such as a processor, generally more sensitive to aging than the passive components of systems-on-a-chip.

According to a first aspect, a method is provided for estimating an operating profile of an integrated circuit of a system-on-a-chip, comprising: a monitoring step comprising an acquisition of at least one physical parameter representative of the use of the integrated circuit, and an evaluation step comprising a determination of an instantaneous state of aging for the integrated circuit, as a function of the at least one physical parameter, and a calculation of a margin of use for the integrated circuit comprising a comparison of the instantaneous state of aging with a presumed state of aging.

According to one embodiment, the acquisition of the at least one physical parameter and the determination of the margin of use are carried out in real time, periodically.

The at least one physical parameter representative of the use of the integrated circuit may comprise the temperature and/or the voltage and/or the duration of activity and/or the time.

The evaluation step advantageously comprises the recording of the margin of use and of the instantaneous state of aging of the integrated circuit prior to each power down of the system-on-a-chip and a calculation of a later instantaneous state of aging as a function of a previous saved instantaneous state of aging.

The determination of the instantaneous state of aging of the integrated circuit may comprise a calculation of an acceleration factor in voltage between a normal usage power supply voltage of the integrated circuit and a measured power supply voltage of the integrated circuit, and/or a calculation of an acceleration factor in temperature between a normal usage temperature of the integrated circuit and a measured temperature of the integrated circuit, and/or a calculation taking into account the cumulated duration of activity of the integrated circuit.

The presumed state of aging of the integrated circuit may correspond to an estimated state of aging multiplied by an effective fractional utilization equal to the ratio between a cumulated duration of activity of the integrated circuit and an estimated lifetime, the estimated state of aging and the estimated lifetime being pre-established based on a given utilization model for the integrated circuit.

The given utilization model may advantageously be configured by a user of the system-on-a-chip.

According to one embodiment, the calculation of the margin of use of the integrated circuit comprises the subtraction of the instantaneous state of aging from the presumed state of aging.

According to another aspect, a system-on-a-chip is provided, comprising at least one integrated circuit and one device for estimating an operating profile of an integrated circuit, the estimation device comprising: a monitoring circuit configured for acquiring at least one physical parameter representative of the use of the integrated circuit, and an evaluation circuit configured for determining an instantaneous state of aging of the integrated circuit, as a function of the at least one physical parameter, and for calculating a margin of use of the integrated circuit by comparing the instantaneous state of aging with a presumed state of aging.

According to one embodiment, the monitoring circuit and the evaluation circuit are respectively configured for acquiring the at least one physical parameter and determining the margin of use in real time, periodically.

The system-on-a-chip may further comprise at least one in-situ sensor configured for measuring the at least one physical parameter representative of the use of the integrated circuit, where the at least one in-situ sensor can comprise a temperature sensor and/or a voltage sensor and/or a sensor for duration of activity and/or a timer.

According to one embodiment in which the system-on-a-chip comprises a non-volatile memory, the evaluation circuit is configured for recording the margin of use and the instantaneous state of aging of the integrated circuit in the non-volatile memory prior to each power down of the system-on-a-chip and for calculating a later instantaneous state of aging as a function of a previous saved instantaneous state of aging.

According to one embodiment, the evaluation circuit is configured for determining the instantaneous state of aging of the integrated circuit by: calculating a voltage acceleration factor between a normal usage power supply voltage of the integrated circuit and a measured power supply voltage of the integrated circuit, and/or calculating a temperature acceleration factor between a normal usage temperature of the integrated circuit and a measured temperature of the integrated circuit, and/or as a function of the cumulated duration of activity of the integrated circuit.

The evaluation circuit may be configured for determining the presumed state of aging of the integrated circuit by applying, to an estimated state of aging, an effective fractional utilization equal to the ratio between the cumulated duration of activity of the integrated circuit and a presumed lifetime, the estimated state of aging and the estimated lifetime being pre-established based on a given utilization model for the integrated circuit.

The system-on-a-chip may furthermore comprise a user configuration circuit designed to enable a user of the system-on-a-chip to configure the given utilization model.

The evaluation circuit may be configured for calculating the margin of use for the integrated circuit by subtracting the instantaneous state of aging from the presumed state of aging.

The system-on-a-chip may comprise a calculation unit, in which case the evaluation circuit comprises software modules implemented within the processor.

A device is further provided such as a computer or a mobile telephone comprising a system-on-a-chip such as previously defined.

Thus, in the embodiments and their implementation previously defined, the management of the lifetime uses real data on power supply, on temperature or on activity, and the adjustment of the power supply may be carried out at any operating point during the lifetime of the system-on-a-chip.

Moreover, the embodiments and their implementation previously defined can allow, for example, the management parameters for the aging process to be rendered controllable by the user, or furthermore, concrete information on the effective remaining lifetime of the system-on-a-chip to be supplied to software applications.

Indeed, these embodiments and their implementation allow an additional quantitative parameter to be provided in order for example to establish a guarantee of the performance characteristics of a system-on-a-chip.

Also disclosed herein is a method for determining a margin of use of an integrated circuit. This method includes monitoring at least one sensor so as to determine at least one physical parameter representative of use of the integrated circuit, evaluating the at least one physical parameter to determine an instantaneous state of aging of the integrated circuit as a function of the at least one physical parameter, calculating the margin of use for the integrated circuit from a comparison of the instantaneous state of aging with a presumed state of aging, and if the margin of use is outside of a given limit, adjusting at least one operating performance point of the integrated circuit so as to bring the margin of use back within the given limit.

The at least one operating performance point of the integrated circuit may be adjusted by adjusting a power supply voltage for the integrated circuit, adjusting a clock frequency for the integrated circuit, or adjusting a substrate voltage for the integrated circuit.

The at least one operating performance point of the integrated circuit may be adjusted by adjusting a voltage or frequency of the operating point.

The monitoring, evaluating, calculating, and adjustment of the at least one operating performance point may be performed substantially continuously.

The monitoring, evaluating, calculating, and adjustment of the at least one operating performance point may be performed within one second.

The monitoring, evaluating, calculating, and adjustment of the at least one operating performance point may be performed within one microsecond second.

Evaluating the at least one physical parameter may include calculating a later instantaneous state of aging as a function of a saved previous instantaneous state of aging.

Evaluating the at least one physical parameter may include calculating an acceleration factor in voltage between a normal usage power supply voltage of the integrated circuit and a measured power supply voltage of the integrated circuit, and/or calculating an acceleration factor in temperature between a normal usage temperature of the integrated circuit and a measured temperature of the integrated circuit.

Evaluating the at least one physical parameter to determine an instantaneous state of aging of the integrated circuit may include calculating the instantaneous state of aging taking into account a cumulated duration of activity of the integrated circuit.

The presumed state of aging of the integrated circuit may be determined by multiplying an estimated state of aging by an effective fractional utilization equal to a ratio between a cumulated duration of activity of the integrated circuit and an estimated lifetime.

Calculating the margin of use of the integrated circuit may include subtracting the instantaneous state of aging from the presumed state of aging.

The instantaneous state of aging of the integrated circuit may reflect real aging of the integrated circuit, the presumed state of aging may reflect predicted aging of the integrated circuit, and the predicted aging may be predicted within a given mission profile.

The margin of use may be associated with permitted operating limits of the integrated circuit, and the permitted operating limits may be limits of a power supply voltage supplied to the integrated circuit and of an operating frequency of the integrated circuit.

Also disclosed herein is a system-on-a-chip including at least one integrated circuit, and a circuit configured to determining a margin of use of an integrated circuit. This circuit includes a monitoring circuit configured to acquire at least one physical parameter representative of use of the integrated circuit from at least one sensor, an evaluation circuit configured to determine an instantaneous state of aging of the integrated circuit as a function of the at least one physical parameter and calculate a margin of use of the integrated circuit as a function of a comparison of the instantaneous state of aging with a presumed state of aging, and an adjustment circuit configured to adjust at least one operating performance point of the integrated circuit so as to bring the margin of use back within a given limit, if the margin of use is outside of the given limit.

The adjustment circuit may adjust the at least one operating performance point of the integrated circuit by modifying a power supply voltage for the system-on-a-chip generated by a switched mode power supply.

A non-volatile memory and a secure area may be present, and the secure area may be configured to recording the margin of use and the instantaneous state of aging of the integrated circuit in the non-volatile memory prior to each power down of the system-on-a-chip.

The evaluation circuit may also be configured to calculate a later instantaneous state of aging as a function of a previous instantaneous state of aging saved by the secure area into the non-volatile memory.

At least one sensor may be configured to measure the at least one physical parameter.

The evaluation circuit may be configured to determine the instantaneous state of aging of the integrated circuit by calculating an acceleration factor in voltage between a normal usage power supply voltage of the integrated circuit and a measured power supply voltage of the integrated circuit, and/or calculating an acceleration factor in temperature between a normal usage temperature of the integrated circuit and a measured temperature of the integrated circuit.

The evaluation circuit may be configured to calculating the instantaneous state of aging as a function of a cumulated duration of activity of the integrated circuit.

The instantaneous state of aging of the integrated circuit may reflect real aging of the integrated circuit, the presumed state of aging may reflect predicted aging of the integrated circuit, and the predicted aging may be predicted within a given mission profile.

The margin of use may be associated with permitted operating limits of the integrated circuit, and the permitted operating limits may be limits of a power supply voltage supplied to the integrated circuit and of an operating frequency of the integrated circuit.

BRIEF DESCRIPTION OF THE DRAWINGS

Other advantages and features will become apparent upon examining the detailed description of embodiments and their implementation, which are in no way limiting, and from the appended drawings in which.

DETAILED DESCRIPTION

Figure 1:
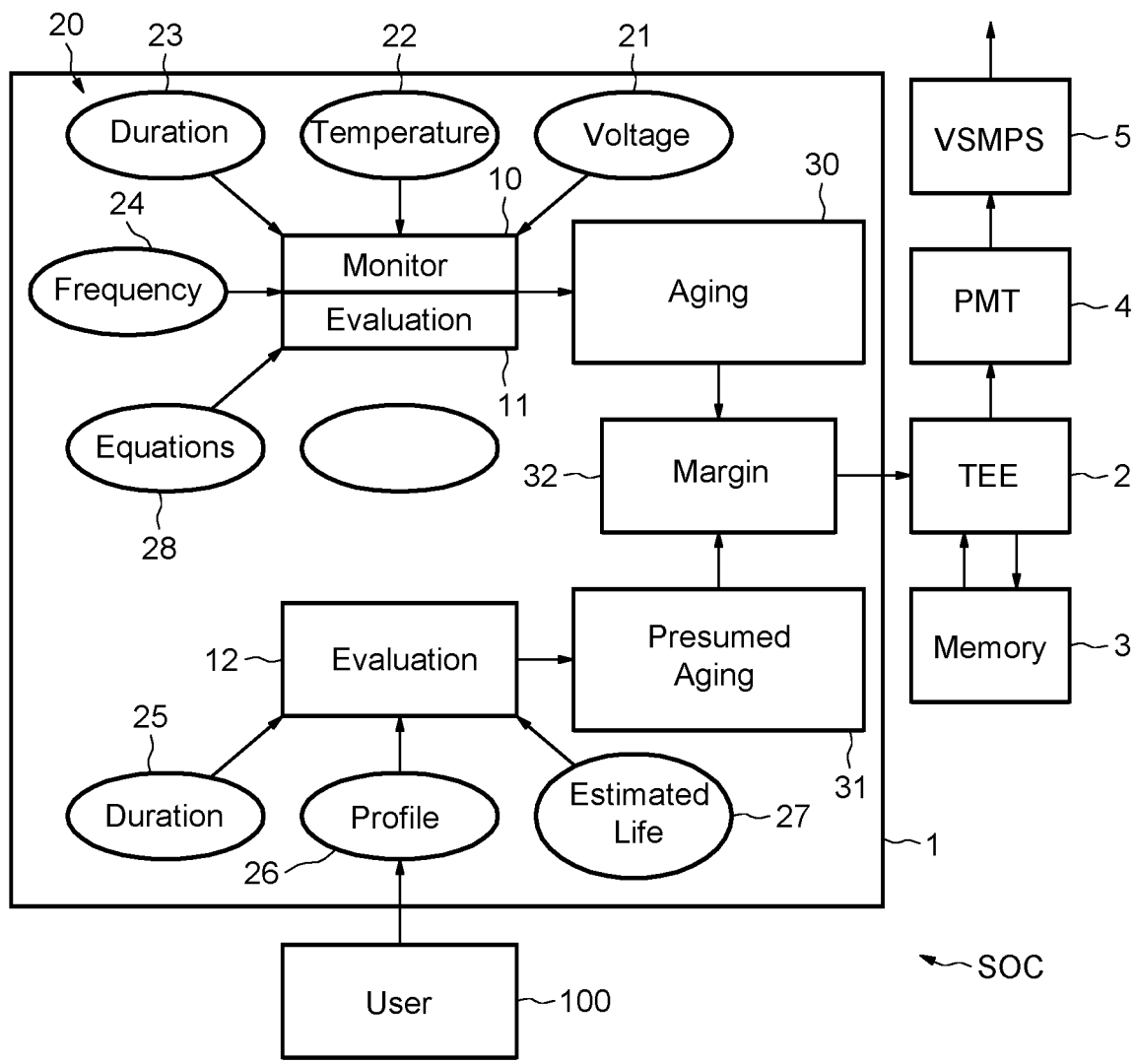
FIG. 1 shows a system-on-a-chip SoC.

FIG. 1 shows a system-on-a-chip SoC comprising a calculation unit 1, otherwise known as a processor, notably configured for implementing and executing software functions.

The system-on-a-chip usually comprises passive components and active components, such as integrated circuits, not shown for the sake of simplification of the figures.

An integrated circuit, forming for example the processor 1, is configured for operating in an optimal manner at an operating point specific to it.

To be precise, an operating point, or operating performance point (OPP), as known to those skilled in the art is an expression used in order to denote a good compromise between the parameters that are applied to a component, for example its power supply voltage and its operating frequency, allowing an integrated circuit to operate in an optimal manner.

The power supply voltage is usually generated by a voltage switched-mode power supply (VSMPS) circuit 5, which is generally controlled by a microcontroller dedicated to the management of the basic parameters allowing the operation of a system-on-a-chip.

The system-on-a-chip SoC also comprises a secure processor 2, or a secure part of a processor (commonly referred to as a Trusted Execution Environment (TEE)), a non-volatile memory 3, together with an adjustment circuit (PMT) 4 capable of modifying at least the power supply voltage generated by the switched-mode power supply stage 5 for various integrated circuits of the system-on-a-chip SoC.

The secure processor 2 is configured for reading and writing in the non-volatile memory 3, preferably in a secure area of the memory 3, and for controlling the adjustment circuit 4.

The adjustment circuit 4 may, for example, comprise the microcontroller dedicated to the management of the basic parameters allowing the aforementioned system-on-a-chip to be operated, and/or may for example be of the same nature as the adaptive adjustment circuits for the voltage or for the frequency (AVF/AFS) described in U.S. Pat. No. 8,154,335.

The circuits of the type AVF/AFS react to a signal representative of a margin of use, by adjusting the voltage and/or the frequency of an operating point in such a manner that the performance characteristics of the integrated circuit are optimized, within the limits permitted for the margin of use.

A monitoring circuit 10 acquires physical parameters 20 representative of the use of an integrated circuit, for example by virtue of in-situ sensors.

The in-situ sensors are sensors included within the integrated circuit.

The physical parameters 20 may, for example, comprise the voltage 21, the temperature 22, the duration of activity of the integrated circuit 23, or else its operating frequency 24.

Figure 2:
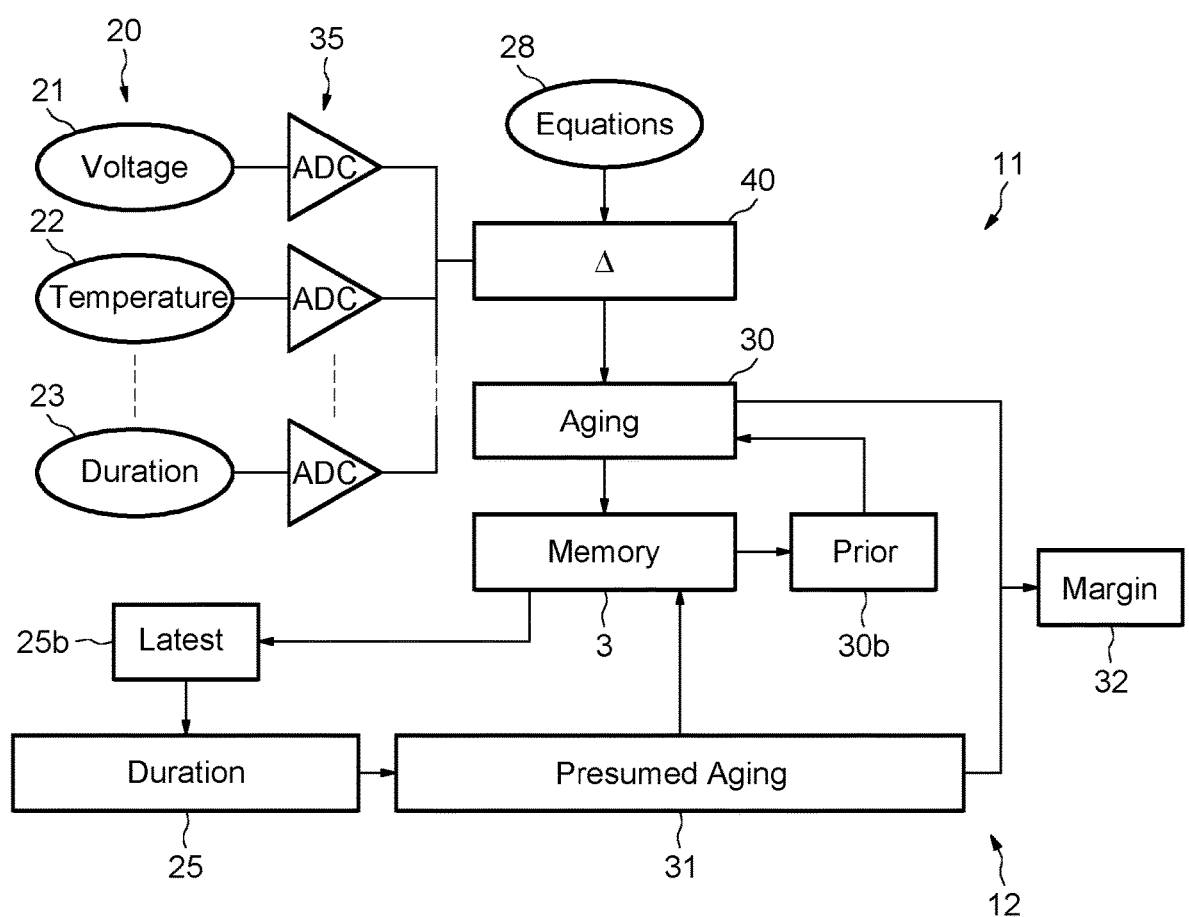
FIG. 2 shows the calculation of the margin of use of an integrated circuit.

An evaluation circuit 11 is configured for determining an instantaneous state of aging 30 of the integrated circuit, based on the measured physical parameters 20, previously converted into digital signals by analog to digital converters (ADC) 35 (FIG. 2).

A second evaluation circuit 12 is configured for determining a presumed state of aging 31, depending only on the cumulated duration of activity 25 and on a mission profile 26.

The two evaluation circuit 11 and 12 are here shown as separate processing circuits but may consist of a single evaluation circuit, for example formed by software within and executed by the processor 1.

The evaluation circuit is/are also configured for calculating a margin of use 32 of the integrated circuit.

FIG. 2 shows one embodiment of the calculation of the margin of use of an integrated circuit.

The instantaneous state of aging 30 "$State_{i+1}$" is calculated based on the preceding (prior) instantaneous state of aging 30b "$State_i$" to which a value of variation $\Delta$ is added.

This variation value $\Delta$ is calculated (step 40) using the equations 28 (FIG. 1) modeling the wear specific to an integrated circuit as a function of the measured physical parameters 20.

Such equations 28 may, for example, come from models used in the industry standards such as JEDEC/JESD74, notably equations used for modeling endurance tests. Those skilled in the art will be able to refer to them at their convenience.

By way of illustration, it is possible to use the exponential model of acceleration factor in voltage (Acceleration Factor Voltage (AFV)):

$$AFV = \exp[B*(Vs-Vu)]$$

with B a constant, Vs a voltage referred to as stress voltage and Vu a voltage referred to as a normal usage voltage.

For calculating the variation $\Delta$ of instantaneous state of aging, the measured value of the voltage is injected into the variable Vs and a voltage corresponding to a reference usage into the variable Vu.

Similarly, it is possible to use the exponential model of acceleration factor in temperature (Acceleration Factor Temperature (AFT)) for calculating the variation $\Delta$ of instantaneous state of aging:

$$AFT = \exp[(Ea/k_B)*(1/Tu-1/Ts)]$$

with Ea the activation energy, $k_B$ Boltzmann's constant, Ts a temperature referred to as stress temperature and Tu a temperature referred to as a normal usage temperature, by injecting the value of the measured temperature into the variable Ts and a reference temperature into the variable Tu.

The evaluation circuit is configured for establishing a presumed state of aging 31, by multiplying an estimated state of aging by an effective fractional utilization for a use in the given mission profile 26.

The effective fractional utilization is equal to the ratio between the cumulated duration of activity 25 and the estimated total lifetime 27 for an integrated circuit in the given mission profile 26.

At the start of a period of activity of an integrated circuit, the evaluation circuit reads the latest value of the cumulated duration of activity 25b of the integrated circuit, "$duration_i$", in the memory 3, and logs the time passed $\Delta t$ during the period of activity.

After the period of activity, the evaluation circuit adds the timed duration of activity $\Delta t$ to the preceding value of cumulated duration of activity 25b "$duration_i$" and records the new value of cumulated duration of activity 25 "$duration_{i+1}$" in the memory 3.

The mission profile may be fixed during the design of the system-on-a-chip to handle the most challenging conditions, for example of the industrial conditions type.

As a variant, the mission profile 26 may be configured by a user 100, notably within the framework of systems-on-a-chip designed to fulfill various different missions. The configuration may, for example, be an initialization during the first power-up of the system-on-a-chip or else a modification in the course of the lifetime of the system-on-a-chip.

In other words, the instantaneous state of aging reflects the real aging of the integrated circuit, whereas the presumed state of aging reflects the predicted aging of the integrated circuit, within a given mission profile.

The difference between the instantaneous state of aging 30 and the presumed state of aging 31 yields a value of the margin 32.

The margin 32 thus calculated may, for example, serve as a reference margin for voltage and/or frequency adaptation means (AVF/AFS) of the type of those described in U.S. Pat. No. 8,154,335.

The secure processor 2 controls the adjustment of the operating points implemented by the adjustment circuit 4, notably in order to avoid any corruption external to the system-on-a-chip as such.

The adjustment of the performance points in order to bring them back into the margin of use can notably be implemented by modifying the value of the power supply voltage, the clock frequency, the potential of the substrate, or other operating parameters of the integrated circuits of the system-on-a-chip.

Advantageously, the steps for reading and writing in the memory 3 are also implemented by the secure processor 2, also in order to avoid an external corruption.

The physical measurements, the evaluations of the states of aging and the adjustments of operating points are carried out in continuous mode, within a time period in the range between a microsecond and a second.

Figure 3:
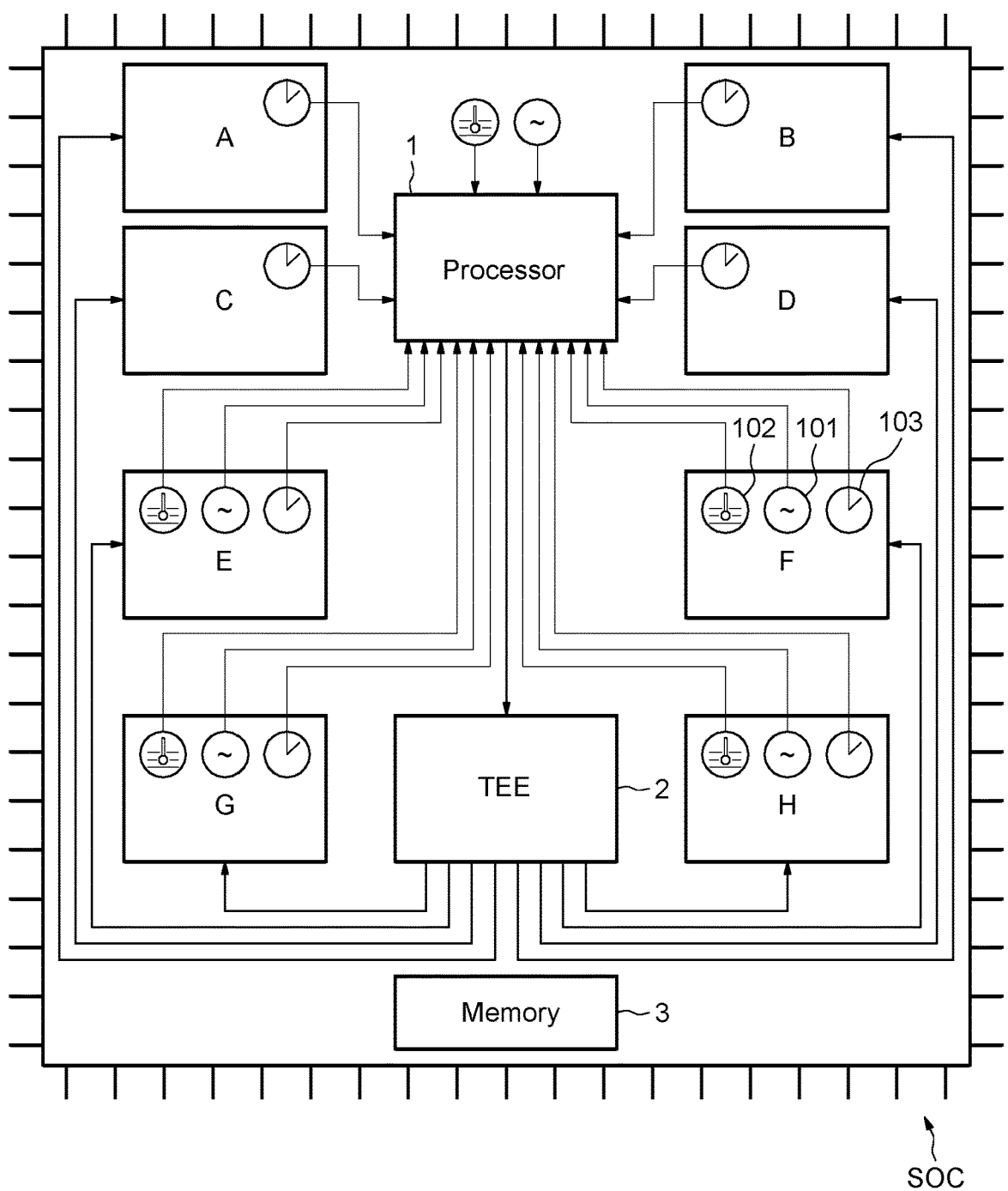
FIG. 3 shows a system-on-a-chip SoC with integrated circuits equipped with sensors for observing various physical parameters.

FIG. 3 shows one embodiment of a system-on-a-chip SoC, in which various integrated circuits A, B, C, D, E, F, G, H are equipped with analog and/or analog to digital sensors 101, 102, 103 allowing various physical parameters to be observed and their measurements to be acquired and routed to the processor 1.

For example, the sensors may comprise a voltmeter 101, a thermometer 102 and a timer 103.

The processor 1 transmits the margin values 32 to a secure processor TEE 2 which will control the operating points of the various integrated circuits A-H.

Figure 4:
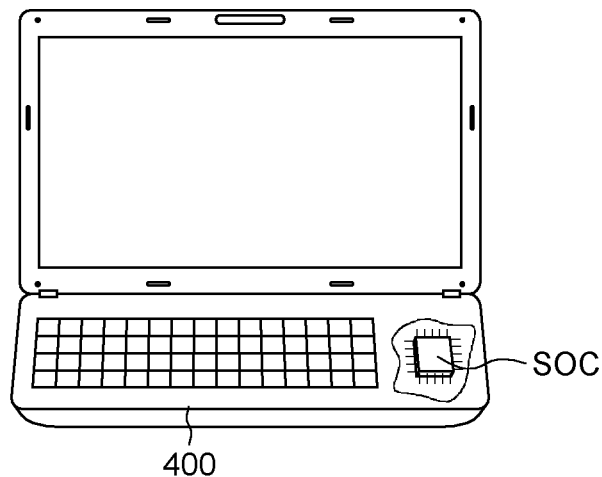
FIGS. 4 and 5 show examples of products equipped with a system-on-a-chip SoC.
Figure 5:
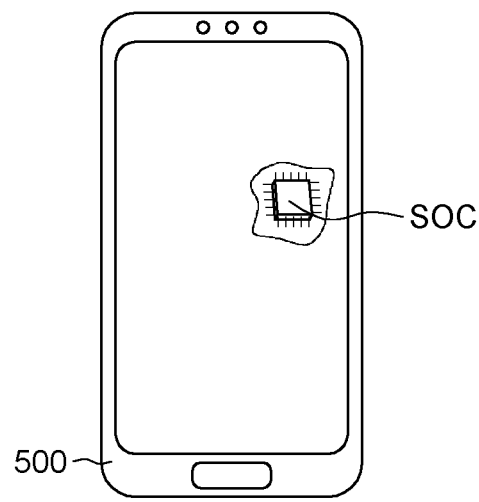

FIGS. 4 and 5 each show examples of products equipped with one embodiment of a system-on-a-chip SoC such as previously detailed: respectively, a personal computer 400 and a mobile telephone 500. It will be evident to those skilled in the art that the embodiments of a system-on-a-chip SoC previously detailed may be included in any other known product not mentioned here.

It goes without saying that the solution for management of the aging provided is not limited to the embodiments and their implementation detailed hereinabove but encompasses all their variants. For example, passive components or components other than integrated circuits implementing the logic of a processor may benefit from such a management of their aging.

Moreover, the solution provided is applicable to any type of system-on-a-chip irrespective of its function.

Furthermore, the embodiments and their implementation described are applied to a single operating point of an integrated circuit, but it is notably possible for numerous operating points of various components of the system-on-a-chip, or else a global operating point, or indeed only the most critical operating points, to be simultaneously or independently managed.

The invention claimed is:

1. A method for determining a margin of use of an integrated circuit, the method comprising:
monitoring at least one sensor so as to determine at least one physical parameter representative of use of the integrated circuit;
evaluating the at least one physical parameter to determine an instantaneous state of aging of the integrated circuit as a function of the at least one physical parameter;
calculating the margin of use for the integrated circuit from a comparison of the instantaneous state of aging with a presumed state of aging; and
if the margin of use is outside of a given limit, adjusting at least one operating performance point of the integrated circuit so as to bring the margin of use back within the limit.

2. The method of claim 1, wherein the at least one operating performance point of the integrated circuit is adjusted by adjusting a power supply voltage for the integrated circuit, adjusting a clock frequency for the integrated circuit, or adjusting a substrate voltage for the integrated circuit.

3. The method of claim 1, wherein the at least one operating performance point of the integrated circuit is adjusted by adjusting a voltage or frequency of the operating performance point.

4. The method of claim 1, wherein the monitoring, evaluating, calculating, and adjustment of the at least one operating performance point is performed substantially continuously.

5. The method of claim 1, wherein the monitoring, evaluating, calculating, and adjustment of the at least one operating performance point is performed within one second.

6. The method of claim 1, wherein the monitoring, evaluating, calculating, and adjustment of the at least one operating performance point is performed within one microsecond.

7. The method of claim 1, wherein evaluating the at least one physical parameter comprises:
calculating a later instantaneous state of aging as a function of a saved previous instantaneous state of aging.

8. The method of claim 1, wherein evaluating the at least one physical parameter comprises at least one of:
calculating an acceleration factor in voltage between a normal usage power supply voltage of the integrated circuit and a measured power supply voltage of the integrated circuit; and
calculating an acceleration factor in temperature between a normal usage temperature of the integrated circuit and a measured temperature of the integrated circuit.

9. The method of claim 1, wherein evaluating the at least one physical parameter to determine an instantaneous state of aging of the integrated circuit includes calculating the instantaneous state of aging taking into account a cumulated duration of activity of the integrated circuit.

10. The method of claim 1, wherein the presumed state of aging of the integrated circuit is determined by: multiplying an estimated state of aging by an effective fractional utilization equal to a ratio between a cumulated duration of activity of the integrated circuit and an estimated lifetime.

11. The method of claim 1, wherein calculating the margin of use of the integrated circuit comprises subtracting the instantaneous state of aging from the presumed state of aging.

12. The method of claim 1, wherein the instantaneous state of aging of the integrated circuit reflects real aging of the integrated circuit, wherein the presumed state of aging reflects predicted aging of the integrated circuit, and wherein the predicted aging is predicted within a given mission profile.

13. The method of claim 1, wherein the margin of use is associated with permitted operating limits of the integrated circuit, and wherein the permitted operating limits are limits of a power supply voltage supplied to the integrated circuit and of an operating frequency of the integrated circuit.

14. A system-on-a-chip, comprising;
at least one integrated circuit; and
a circuit configured to determining a margin of use of an integrated circuit, the circuit comprising:
a monitoring circuit configured to acquire at least one physical parameter representative of use of the integrated circuit from at least one sensor;
an evaluation circuit configured to determine an instantaneous state of aging of the integrated circuit as a function of the at least one physical parameter and calculate a margin of use of the integrated circuit as a function of a comparison of the instantaneous state of aging with a presumed state of aging; and
an adjustment circuit configured to adjust at least one operating performance point of the integrated circuit so as to bring the margin of use within a given limit, if the margin of use is outside the limit.

15. The system-on-a-chip of claim 14, wherein the adjustment circuit adjusts the at least one operating performance point of the integrated circuit by modifying a power supply voltage for the system-on-a-chip generated by a switched mode power supply.

16. The system-on-a-chip of claim 14, further comprising a non-volatile memory and a secure area, wherein the secure area is configured to record the margin of use and the instantaneous state of aging of the integrated circuit in the non-volatile memory prior to each power down of the system-on-a-chip.

17. The system-on-a-chip of claim 16, wherein the evaluation circuit is also configured to calculate a later instantaneous state of aging as a function of a previous instantaneous state of aging saved by the secure area into the non-volatile memory.

18. The system-on-a-chip of claim 14, further comprising at least one sensor configured to measure the at least one physical parameter.

19. The system-on-a-chip of claim 14, wherein the evaluation circuit is configured to determine the instantaneous state of aging of the integrated circuit by at least one of:
   calculating an acceleration factor in voltage between a normal usage power supply voltage of the integrated circuit and a measured power supply voltage of the integrated circuit; and
   calculating an acceleration factor in temperature between a normal usage temperature of the integrated circuit and a measured temperature of the integrated circuit.

20. The system-on-a-chip of claim 14, wherein the evaluation circuit is configured to calculating the instantaneous state of aging as a function of a cumulated duration of activity of the integrated circuit.

21. The system-on-a-chip of claim 14, wherein the instantaneous state of aging of the integrated circuit reflects real aging of the integrated circuit, wherein the presumed state of aging reflects predicted aging of the integrated circuit, and wherein the predicted aging is predicted within a given mission profile.

22. The system-on-a-chip of claim 1, wherein the margin of use is associated with permitted operating limits of the integrated circuit, and wherein the permitted operating limits are limits of a power supply voltage supplied to the integrated circuit and of an operating frequency of the integrated circuit.

* * * * *